United States Patent
He et al.

(10) Patent No.: US 7,463,030 B2
(45) Date of Patent: Dec. 9, 2008

(54) HIFU-COMPATIBLE RECEPTION COIL FOR MRI RF SIGNALS AND SIGNAL RECEIVING METHOD

(75) Inventors: Zeng He He, Shenzhen (CN); Markus Vester, Nuremberg (DE); Jian Min Wang, Shenzhen (CN); Yang Wang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/839,756

(22) Filed: Aug. 16, 2007

(65) Prior Publication Data

US 2008/0042651 A1    Feb. 21, 2008

(30) Foreign Application Priority Data

Aug. 16, 2006    (CN) .................... 2006 1 0112404

(51) Int. Cl.
*G01V 3/00* (2006.01)

(52) U.S. Cl. ........................ 324/318; 324/309

(58) Field of Classification Search ......... 324/300–322; 600/407–449; 382/128
See application file for complete search history.

(56) References Cited

U.S. PATENT DOCUMENTS 4,920,522 A * 4/1990 Duerr et al. ................. 367/134
6,246,783 B1 * 6/2001 Avinash ...................... 382/128
7,155,271 B2 * 12/2006 Halperin et al. ............. 600/411

\* cited by examiner

*Primary Examiner*—Brij B Shrivastav
(74) *Attorney, Agent, or Firm*—Schiff Hardin LLP

(57) ABSTRACT

A HIFU compatible receiving coil for MRI radio-frequency signals has an antenna and an amplifier connected to each other, each for receiving and amplifying MRI radio-frequency signals, and a filter positioned in front of the amplifier for filtering the HIFU low frequency signals received by the antenna at the same time as receiving the MRI radio-frequency signals. In a method for receiving the MRI radio-frequency signals and then for amplifying the same, the received MRI radio-frequency signals are filtered before being amplified, so as to filter out the HIFU signals received at the same time as the MRI radio-frequency signals. By this filtering, the HIFU signals among the HIFU signals and MRI radio-frequency signals simultaneously received by the antenna are filtered out at the same time as the HIFU treatment, and the remaining MRI radio-frequency signals are connected into the MRI system after being amplified by the amplifier for real-time imaging. Since the amplifier only processes the MRI radio-frequency signals, it can stay in a normal linear working status to ensure the normal proceeding of the subsequent real-time imaging.

15 Claims, 2 Drawing Sheets

FIG. 5A
(PRIOR ART)
HIFU OFF
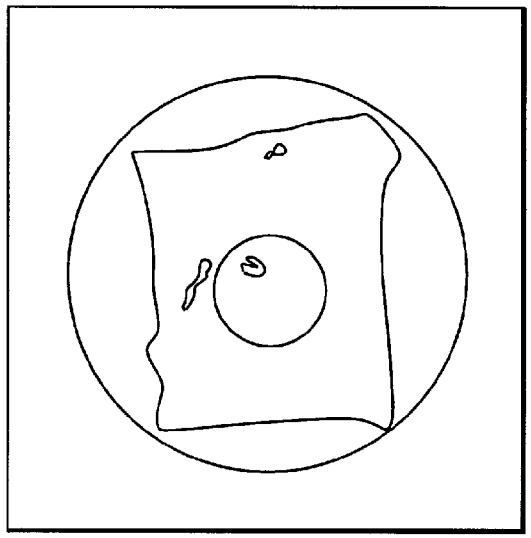
FIG. 6A
HIFU OFF
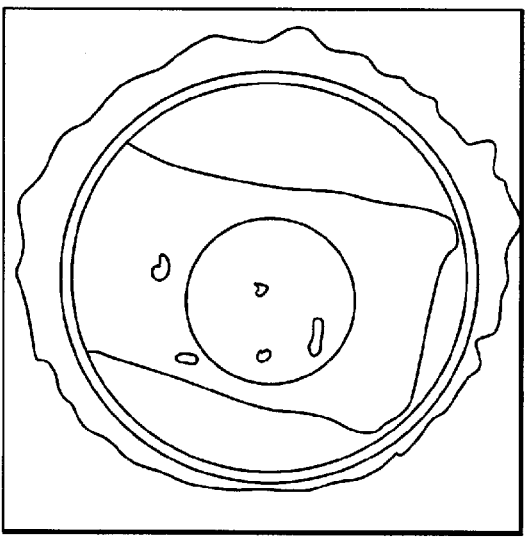
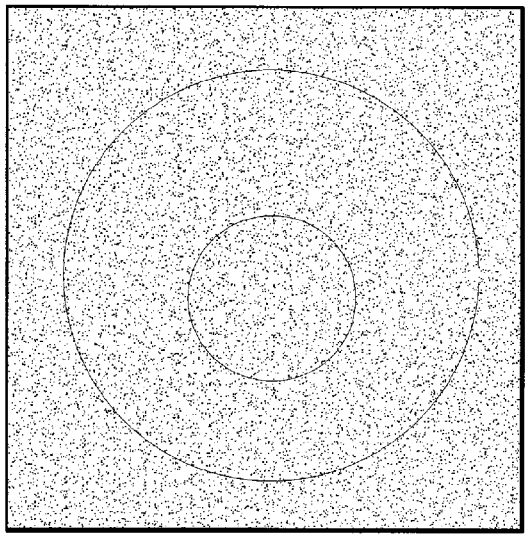
HIFU ON
FIG. 5B
(PRIOR ART)
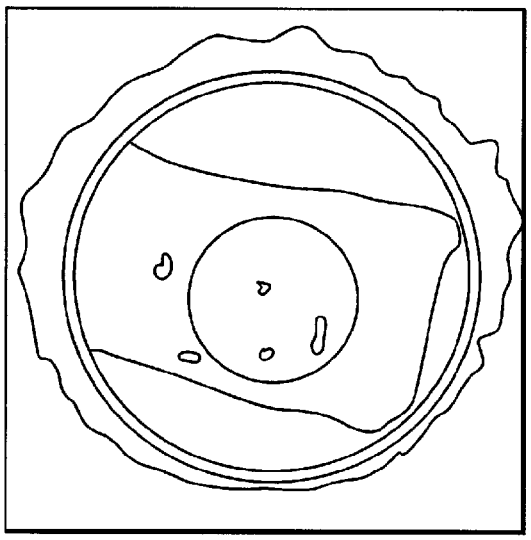
HIFU ON
FIG. 6B

HIFU-COMPATIBLE RECEPTION COIL FOR MRI RF SIGNALS AND SIGNAL RECEIVING METHOD

BACKGROUND OF THE INVENTION

1. Field of the Invention

The present invention relates to a receiving coil for magnetic resonance imaging (MRI), and particularly to a compatible technology of a receiving coil for MRI radio-frequency signals.

2. Description of the Prior Art

Currently an important research direction concerning the development of medical devices is the use of MRI-guided high intensity focused ultrasound (HIFU) equipment.

The new therapeutic method of combining MRI with HIFU allows a physician to locate a disease focus accurately via MRI and then apply high intensity focused ultrasonic waves to the disease focus for treatment, and at the same time the procedure is monitored in real-time by using MRI imaging. In the above-mentioned treatment, it is necessary to ensure the synchronization between the MRI imaging and the HIFU treatment so as to make the real-time MRI imaging possible.

However, currently available ordinary receiving coils for MRI radio-frequency signals are not compatible with HIFU, making it impossible for MRI and HIFU to work in a synchronized manner, thus it is impossible to use MRI real-time imaging in monitoring HIFU treatments.

Referring to FIGS. 1 and 2, the two figures show respectively the circuit principles and the logic principles of an ordinary receiving coil for MRI radio-frequency signals (referred to as an "ordinary coil" hereinbelow). An antenna 10 of the ordinary coil is used for receiving MRI radio-frequency signals (when the HIFU is turned on, it receives the MRI radio-frequency signals and the HIFU signals simultaneously), which are then supplied to an amplifier 11 located in a receiving channel after passing a matching circuit, so the received signals are connected into the MRI system after having been amplified. This matching circuit includes, in succession capacitors C10, C12 and C13 which are connected in parallel to the antenna 10, a capacitor C11 which is connected in series between the capacitors C10 and C12, and an inductor L10 which is connected in series between the capacitors C12 and C13.

Further referring to FIG. 5A, when the HIFU system is turned off and not working, this ordinary coil can receive MRI radio-frequency signals in a normal way, and the signals are supplied to the MRI system for normal imaging after having been amplified. However, when the HIFU is turned on, if it were attempted to use the MRI for real-time imaging at the same time so as to monitor the procedure of the HIFU treatment, the ordinary coil would be unable to operate normally, leading to the imaging results as shown in FIG. 5B. The reason responsible for the above-mentioned problem is that when the HIFU is operating, its output power is very high such that the signal intensity in the examination space is much higher than that of the MRI radio-frequency signals. Although the frequency of the HIFU signals is lower than that of the MRI radio-frequency signals, the fact that its signal intensity is extremely high causes the amplifier 11 connected to the antenna 10 to enter into a nonlinear operating state, so it is unable to proceed with the imaging normally. Therefore, it is unable to use the MRI real-time imaging in an MRI-guided HIFU during a HIFU treatment, and the therapy and monitoring have to be effected by operating the HIFU and MRI in an asynchronous manner, and obviously the need for real-time and accurate operation cannot be satisfied.

SUMMARY OF THE INVENTION

An object of the present invention is to provide a HIFU compatible receiving coil for MRI radio-frequency signals and a receiving method thereof, so as to realize the simultaneous normal imaging during the HIFU treatment.

The above object is achieved in accordance with the present invention by a HIFU compatible receiving coil for MRI radio-frequency signals, having an antenna for receiving MRI radio-frequency signals and an amplifier connected to the antenna for amplifying the received MRI radio-frequency signals, wherein a filter is positioned in front of the amplifier for filtering the HIFU signals received by the antenna at the same time as the MRI radio-frequency signals, and the frequency of the HIFU signals is lower than that of the MRI radio-frequency signals.

Preferably, the filter of the present invention is an induction-input single-stage, double-stage or multiple-stage type LC high-pass π-filter. The induction-input LC high-pass π-filter includes an input inductor, a capacitor and an output inductor which have a π-connection. The input inductor is connected in parallel to the two terminals of the antenna; one end of the capacitor is connected to the input inductor with the other end thereof connected to the output inductor; and one end of the output inductor is connected to the capacitor with the other end thereof connected to the input inductor.

The above object also is achieved in accordance with the present invention by a HIFU compatible method for receiving MRI radio-frequency signals, which is used to receive the MRI radio-frequency signals and then to amplify those signals, wherein the received MRI radio-frequency signals are filtered before being amplified, so as to get rid of the HIFU signals received at the same time as the MRI radio-frequency signals by filtering, wherein the frequency of the HIFU signals is lower than that of the MRI radio-frequency signals.

Preferably, the filtering is high-pass filtering, and the high-pass filtering can be single-stage, double-stage or multiple-stage high-pass filtering.

By the above-mentioned filtering, the HIFU signals among the HIFU signals and MRI radio-frequency signals simultaneously received by the antenna can be filtered out at the same time during the HIFU treatment, and the remaining MRI radio-frequency signals, after having been amplified by the amplifier, are connected to the MRI system for real-time imaging. Since the amplifier only processes the MRI radio-frequency signals, it can work normally in a linear working status, so as to ensure the normal proceeding of the subsequent real-time imaging.

BRIEF DESCRIPTION OF THE DRAWINGS

FIGS. 5A and 5B show imaging results by the conventional receiving coil for MRI radiofrequency signals as shown in FIG. 1 when the HIFU is turned on and off, respectively.

FIGS. 6A and 6B show imaging results by the receiving coil for MRI radiofrequency signals according to the present invention as shown in FIG. 3 when the HIFU is turned on and off, respectively.

DESCRIPTION OF THE PREFERRED EMBODIMENTS

Figure 1:
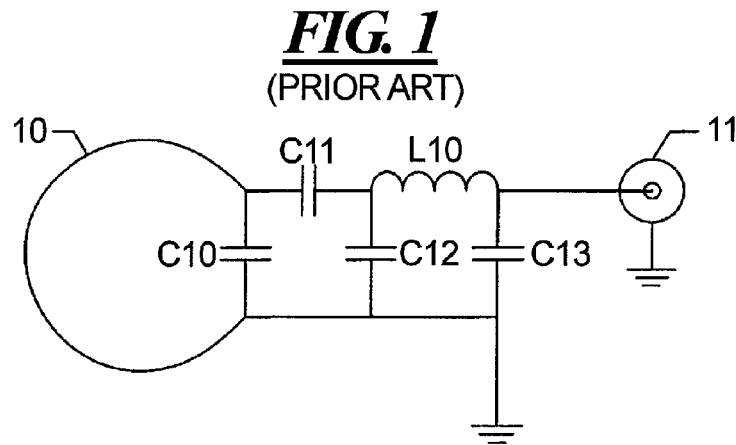
FIG. 1 is a circuit diagram of a conventional receiving coil for MRI radiofrequency signals.
Figure 2:
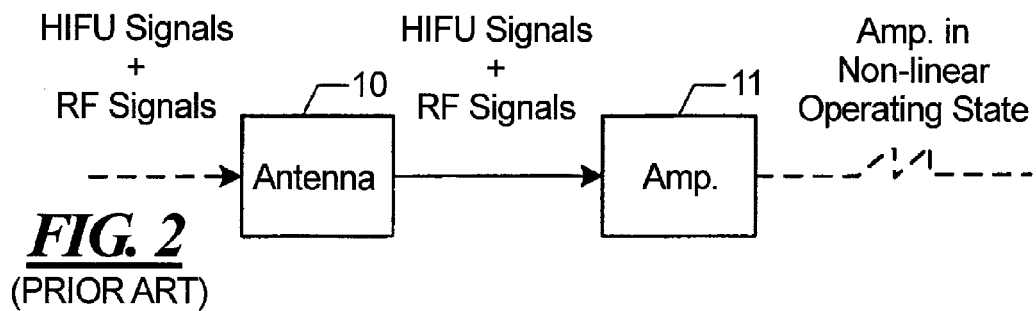
FIG. 2 is a block diagram of the conventional receiving coil for MRI radiofrequency signals in FIG. 1.
Figure 3:
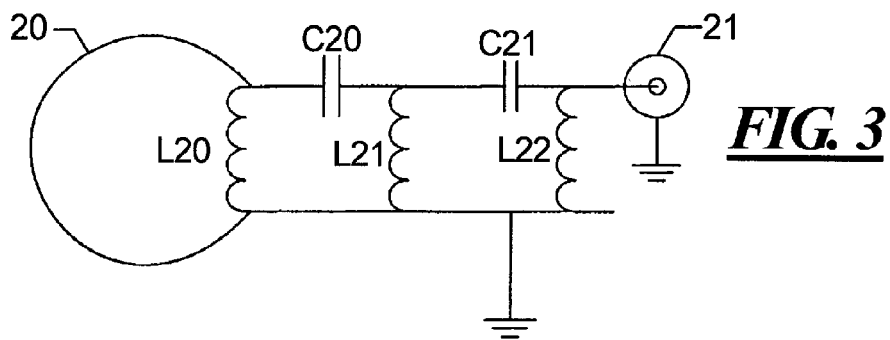
FIG. 3 is a circuit diagram of the basic components of an embodiment of a receiving coil for MRI radiofrequency signals according to the present invention.
Figure 4:
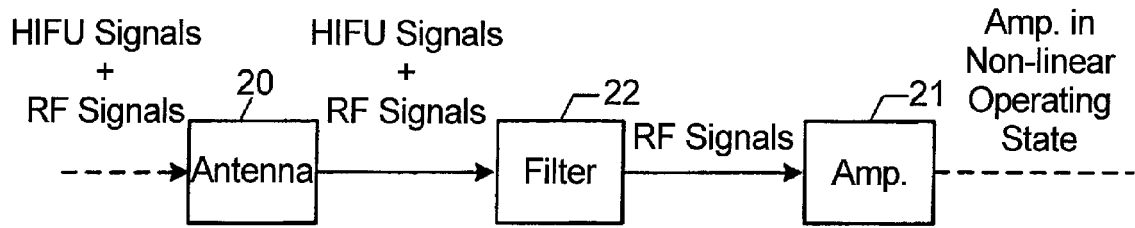
FIG. 4 is a block diagram of the receiving coil for MRI radiofrequency signals according to the present invention in FIG. 3.

With reference to FIGS. 3 and 4, a HIFU compatible receiving coil for MRI radio-frequency signals of the present invention (referred to as "the inventive coil" below) has an antenna 20 and an amplifier 21 connected to each other, wherein the antenna 20 is for receiving MRI radio-frequency signals and the amplifier 21 is for amplifying the MRI radio-frequency signals received. Differing from the conventional antenna described above, the inventive antenna has a filter 22 arranged in front of the amplifier for filtering the HIFU signals received at the same time as said MRI radio-frequency signals by the antenna 20, when the HIFU is turned on. The frequency of the HIFU signals is lower than that of the MRI radio-frequency signals.

If the above-described filtering step were not performed, the extreme high signal intensity of the HIFU would usually make the amplifier 21 entering a nonlinear operating state, thus the normal imaging would not be possible at the same time as the HIFU treatment. Since the frequency of the HIFU signals is much lower than that of MRI radio-frequency signals, taking a 1.5 T MRI-guided HIFU system as an example, the HIFU works at 1 Hz, and the MRI works at 63.6 Hz, therefore by way of filtering performed before the received MRI radio-frequency signals are amplified, the HIFU low frequency signals received at the same time as the MRI radio-frequency signals can be filtered out.

The above-mentioned filter 22 used with the inventive coil is a high-pass filter, which is for filtering the low frequency HIFU signals. Preferably, the high-pass filter is an LC high-pass filter. In order to obtain a better low frequency filtering effect, the filter 22 of the present invention employs an induction-input and a π-filter mode, and the filter 22 can be a single-stage, double-stage or multiple-stage filter according to different requirements. In the present invention, the so-called single-stage, double-stage and multiple-stage filters refer to the condition where the filter 22 includes one, two or more π-filter(s), which are connected in parallel.

With particular reference to FIG. 3, in this embodiment, a double-stage filter is taking as an example to illustrate the principles of the circuit of the filter 22. In FIG. 3, a π-filter is formed by an inductor L20, C20 and L21, and another π-filter is formed by an inductor L21, C21 and L22. Within the π-filter formed by the inductor L20, C20 and L21, the inductor L20 serves as an input inductor, and the inductor L21 serves as an output inductor. The input inductor L20 is connected in parallel to the two terminals of said antenna 20. One end of the capacitor C20 is connected to the input inductor L20. The other end thereof is connected to the output inductor L21; and one end of the output inductor L21 is connected to the capacitor C20, and the other end thereof is connected to the input inductor L20.

In the case that the filter 22 is a single-stage filter, the output inductor L21 is connected to the amplifier 21, so that after the HIFU low frequency signals have been filtered out, the remaining MRI radio-frequency signals are transmitted to the amplifier 21 for amplifying.

In the case that the filter 22 of this embodiment is a double-stage filter, the output inductor L21 in the π-filter formed by the inductor L20, C20 and L21 serves as an input inductor of the π-filter filter formed by the inductor L21, C21 and L22.

The inductor L22 serves as an output inductor and the connection between the input inductor L21, the capacitor C21 and the output inductor L22 is the same as in the above-mentioned π-filter formed by the inductor L20, C20 and L21, so the description need not be repeated.

For the same reason, if the filter 22 is a multiple-stage filter, which includes a number of such LC high-pass π-filters connected in parallel in succession, wherein the output inductor of an LC high-pass π-filter in front serves as the input inductor of an LC high-pass π-filter that follows.

By means of the above-mentioned filter 22 in this invention, the HIFU signals among the HIFU signals and MRI radio-frequency signals simultaneously received by the antenna 20 are filtered out at the same time as the HIFU treatment, so that the remaining MRI radio-frequency signals, after having been amplified by the amplifier 21, are connected to the MRI system for real-time imaging. Since the amplifier 21 only processes the MRI radio-frequency signals, it can stay in a normal linear working status thus to ensure the normal proceeding of the subsequent real-time imaging. With reference to FIGS. 6A and 6B, FIG. 6A shows the results of normal imaging by the inventive coil when the HIFU is turned off, and FIG. 6B shows the results of imaging by the inventive coil which is still normal when HIFU is turned on.

Although modifications and changes may be suggested by those skilled in the art, it is the intention of the inventors to embody within the patent warranted hereon all changes and modifications as reasonably and properly come within the scope of their contribution to the art.

We claim as our invention:

1. A reception coil arrangement comprising:
   an antenna configured to simultaneously receive high intensity focused ultrasound (HIFU) signals simultaneously with reception of magnetic resonance imaging radio-frequency (RF) signals said HIFU signals having a frequency that is lower than a frequency of said RF signals, said RF signals and said HIFU signals being simultaneously present at a signal output of said antenna;
   a filter connected to said signal output of said antenna that filters said HIFU signals out of said signal output of said antenna dependent on said lower frequency of said HIFU signals compared to the frequency of said RF signals, to produce a filtered signal at an output of said filter that is free of said HIFU signals; and
   an amplifier connected to said filter output that amplifies said filtered signal.

2. A reception coil arrangement as claimed in claim 1 wherein said filter is a high-pass filter.

3. A reception coil arrangement as claimed in claim 2 wherein said high-pass filter is a LC high-pass filter.

4. A reception coil arrangement as claimed in claim 3 wherein said LC high-pass filter is a LC high-pass π-filter.

5. A reception coil arrangement as claimed in claim 4 wherein said LC high-pass π-type filter is an induction-input LC high-pass π-filter.

6. A reception coil arrangement as claimed in claim 5 wherein said induction-input π-filter comprises an input conductor, a capacitor and an output conductor connected in a π-configuration.

7. A reception coil arrangement as claimed in claim 6 wherein said antenna output comprises two terminals, and wherein said input inductor is connected in parallel with said two terminals, and wherein a first end of said capacitor is connected to said input inductor and a second end of said capacitor is connected to a first end of said output inductor, and wherein a second end of said output inductor is connected to said input inductor.

8. A reception coil arrangement as claimed in claim 7 wherein said induction-input LC high-pass π-filter is a single-stage filter comprising one LC high-pass π-filter.

9. A reception coil arrangement as claimed in claim 7 wherein said induction-input LC high-pass π-filter is a double-stage filter comprising a front LC high-pass π-filter and a rear LC high-pass π-filter connected in parallel, said output inductor of said front LC high-pass π-filter serving as the input inductor of said rear LC high-pass π-filter.

10. A reception coil arrangement as claimed in claim 7 wherein said induction-input LC high-pass π-filter is a multiple-stage filter comprising a cascaded succession of a plurality of LC high-pass π-filters connected in parallel, with each output inductor of a preceding LC high-pass π-filter in said succession serving as the input inductor of the next-successive LC high-pass π-filter in said succession.

11. A method for receiving and amplifying magnetic resonance imaging radio-frequency (RF) signals, comprising the steps of:

with an antenna, simultaneously receiving magnetic resonance imaging RF signals and high intensity focused ultrasound (HIFU) signals and, at an output of the antenna, emitting an antenna output signal that is a combination of said RF signals and said HIFU signals, said HIFU signals having a lower frequency than a frequency of said RF signals;

filtering said antenna output to remove said HIFU signals dependent on said HIFU signals having said lower frequency, to produce a filtered signal that is free of said HIFU signals; and amplifying said filtered signal.

12. A method as claimed in claim 11 comprising high-pass filtering said antenna output.

13. A method as claimed in claim 12 comprising high-pass filtering said antenna output in a single-stage high-pass filter.

14. A method as claimed in claim 12 comprising high-pass filtering said antenna output in a double-stage high-pass filter.

15. A method as claimed in claim 12 comprising high-pass filtering said antenna output in a multiple-stage high-pass filter.

* * * * *